(12) United States Patent
Goodwin et al.

(10) Patent No.: US 9,213,227 B2
(45) Date of Patent: Dec. 15, 2015

(54) CUSTOM COLOR OR POLARIZATION SENSITIVE CCD FOR SEPARATING MULTIPLE SIGNALS IN AUTOFOCUS PROJECTION SYSTEM

(75) Inventors: Eric Peter Goodwin, Tucson, AZ (US); Daniel Gene Smith, Tucson, AZ (US)

(73) Assignee: NIKON CORPORATION (JP)

( * ) Notice: Subject to any disclaimer, the term of this patent is extended or adjusted under 35 U.S.C. 154(b) by 491 days.

(21) Appl. No.: 13/588,919

(22) Filed: Aug. 17, 2012

(65) Prior Publication Data
US 2013/0208104 A1 Aug. 15, 2013

Related U.S. Application Data

(60) Provisional application No. 61/575,330, filed on Aug. 18, 2011.

(51) Int. Cl.
| | |
|---|---|
| *G03B 21/53* | (2006.01) |
| *G02B 7/36* | (2006.01) |
| *G01B 11/25* | (2006.01) |
| *G03F 9/00* | (2006.01) |
| *H05K 13/08* | (2006.01) |
| *G01J 3/36* | (2006.01) |
| *G01J 3/02* | (2006.01) |

(52) U.S. Cl.
CPC ............ *G03B 21/53* (2013.01); *G01B 11/2509* (2013.01); *G02B 7/36* (2013.01); *G03F 9/7026* (2013.01); *G03F 9/7049* (2013.01); *G01J 3/0224* (2013.01); *G01J 3/36* (2013.01)

(58) Field of Classification Search
USPC ............... 348/87, 266; 702/94; 356/369, 364, 356/622, 614, 616, 603, 496
See application file for complete search history.

(56) References Cited

U.S. PATENT DOCUMENTS

| | | | | |
|---|---|---|---|---|
| 5,440,648 | A * | 8/1995 | Roberts et al. | 382/141 |
| 5,448,332 | A * | 9/1995 | Sakakibara et al. | 355/53 |
| 5,521,706 | A * | 5/1996 | Green et al. | 356/369 |
| 5,870,176 | A * | 2/1999 | Sweatt et al. | 355/53 |
| 6,337,759 | B1 * | 1/2002 | Yamamoto | 359/267 |
| RE37,752 | E * | 6/2002 | Wolff | 348/207.99 |
| 6,671,047 | B2 * | 12/2003 | Opsal et al. | 356/369 |
| 6,714,243 | B1 * | 3/2004 | Mathur et al. | 348/273 |
| 6,771,374 | B1 * | 8/2004 | Rangarajan et al. | 356/445 |
| 6,934,032 | B1 * | 8/2005 | Subramanian et al. | 356/445 |
| 7,265,364 | B2 * | 9/2007 | Teunissen et al. | 250/491.1 |
| 7,280,205 | B2 * | 10/2007 | Bouzid et al. | 356/326 |
| 7,330,274 | B2 * | 2/2008 | Hill | 356/498 |
| 7,554,596 | B2 * | 6/2009 | Nayar et al. | 348/335 |
| 7,575,325 | B2 * | 8/2009 | Suzuki et al. | 353/20 |
| 7,772,555 | B2 * | 8/2010 | Hollingsworth | 250/338.1 |
| 7,982,884 | B2 * | 7/2011 | Smith | 356/622 |

(Continued)

FOREIGN PATENT DOCUMENTS

WO 201217763 A1 9/2012

*Primary Examiner* — Christopher S Kelley
*Assistant Examiner* — Kathleen Walsh
(74) *Attorney, Agent, or Firm* — Yakov Sidorin; Quarles & Brady LLP (57) ABSTRACT

An autofocus (AF) system and method is provided that maps the topography of a substrate such as a semiconductor wafer, in a manner that corrects for Goos Hanchen (GH) effect. In addition, a new and useful detector is provided that is particularly useful in an AF system and method. The detector preferably has both color and polarization filtering integrally associated with the detector, so that polarization and color filtering is provided at the detector, on a pixel by pixel basis.

22 Claims, 5 Drawing Sheets

(56) References Cited

U.S. PATENT DOCUMENTS

| | | | |
|---|---|---|---|
| 8,089,616 B2* | 1/2012 | Owa | 355/77 |
| 8,243,285 B2* | 8/2012 | Fishbaine | 356/603 |
| 8,319,960 B2* | 11/2012 | Aiko et al. | 356/237.2 |
| 2004/0012775 A1* | 1/2004 | Kinney et al. | 356/237.2 |
| 2004/0165169 A1* | 8/2004 | Teunissen et al. | 355/67 |
| 2004/0207836 A1* | 10/2004 | Chhibber et al. | 356/237.4 |
| 2004/0233435 A1* | 11/2004 | Opsal et al. | 356/369 |
| 2006/0132773 A1* | 6/2006 | Ebert et al. | 356/369 |
| 2006/0164657 A1* | 7/2006 | Chalmers et al. | 356/630 |
| 2007/0056940 A1* | 3/2007 | Salem et al. | 219/121.83 |
| 2007/0146697 A1* | 6/2007 | Noguchi et al. | 356/237.5 |
| 2007/0247622 A1* | 10/2007 | Sun | 356/364 |
| 2008/0059218 A1* | 3/2008 | Sottery et al. | 705/1 |
| 2008/0186491 A1* | 8/2008 | Baxter et al. | 356/364 |
| 2008/0243412 A1* | 10/2008 | Horie et al. | 702/82 |
| 2009/0073414 A1* | 3/2009 | Tanitsu et al. | 355/71 |
| 2009/0073441 A1* | 3/2009 | Tanitsu et al. | 356/364 |
| 2009/0108483 A1* | 4/2009 | Suehira et al. | 264/40.5 |
| 2009/0135437 A1* | 5/2009 | Smith | 356/622 |
| 2009/0159799 A1* | 6/2009 | Copeland et al. | 250/338.1 |
| 2009/0168062 A1* | 7/2009 | Straaijer | 356/364 |
| 2009/0316132 A1* | 12/2009 | Tanitsu et al. | 355/71 |
| 2010/0118398 A1* | 5/2010 | Grau | 359/465 |
| 2010/0209832 A1* | 8/2010 | Matsuda | 430/30 |
| 2010/0282945 A1* | 11/2010 | Yokogawa | 250/208.1 |
| 2011/0058038 A1* | 3/2011 | Twede | 348/148 |
| 2011/0071784 A1 | 3/2011 | Smith et al. | |
| 2011/0075134 A1* | 3/2011 | Uto et al. | 356/237.2 |
| 2011/0141309 A1* | 6/2011 | Nagashima et al. | 348/222.1 |
| 2011/0320149 A1* | 12/2011 | Lee et al. | 702/83 |
| 2012/0008150 A1 | 1/2012 | Smith et al. | |
| 2012/0044495 A1* | 2/2012 | Straaijer | 356/369 |
| 2012/0142122 A1* | 6/2012 | Markwort et al. | 438/5 |
| 2013/0308140 A1 | 11/2013 | Goodwin et al. | |

\* cited by examiner

CUSTOM COLOR OR POLARIZATION SENSITIVE CCD FOR SEPARATING MULTIPLE SIGNALS IN AUTOFOCUS PROJECTION SYSTEM

RELATED APPLICATION/CLAIM OF PRIORITY

This application is related to and claims priority from provisional application Ser. No. 61/575,330, entitled "Custom color or polarization sensitive CCD for separating multiple signals in fringe projection system", and filed Aug. 18, 2011, which provisional application is incorporated by reference herein.

INTRODUCTION AND SUMMARY OF PRESENT INVENTION

The present invention relates to an autofocus (AF) system and method that maps the topography of a substrate such as a semiconductor wafer, in a manner that corrects for Goos Hanchen (GH) effect. In addition, the present invention relates to a new and useful detector that is particularly useful in an AF system. The detector preferably has both color and polarization filtering integrally associated with the detector, so that polarization and color filtering is provided at the detector, on a pixel by pixel basis.

The present invention is particularly useful in the manner in which it builds on, and further develops autofocus concepts shown and described in application Ser. Nos. 12/884,890 and 13/066,741, each of which are is incorporated by reference herein.

Application Ser. Nos. 12/884,890 and 13/066,741 explain the basic concept of an autofocus (AF) system that preferably uses fringe projection, and also provides for compensating errors due to the Goos-Hanchen (GH) effect. As explained in those applications, reflected light from the substrate is provided at a plurality of wavelengths and polarizations, detected and used to make corrections that compensate for the errors due to the GH effect. The GH effect produces a shift of a beam when incident on an optical interface (e.g. a substrate that is imaged by an imaging optical system). The substrate surface will produce different phases on reflection for different angles of incidence, polarizations or wavelengths. In an imaging optical system which includes auto focus (AF) illumination of a substrate that is being imaged, this becomes a tilt in the pupil and a shift on the sensor (detector), which in turn translates into an error in the estimate of the z-position of the substrate.

Application Ser. Nos. 12/884,890 and 13/066,741 show and describes wavelength color filtering, utilizing, e.g., a plurality of mirrors, and polarization filtering, as ways of enabling the system to compensate GH errors. In both types of filtering, optical components are provided spatially separated from the detector (in the sense that they are not in direct mechanical contact with the detector. The applications also describe the manner in which processing software is used to provide topography mapping that compensates for GH errors. This processing is basically a weighted combination of the measurements made at different wavelengths and/or polarizations to obtain a surface measurement with minimal errors due to the Goos-Hanchen effect.

In a fringe projection AF system of the type disclosed in U.S. application Ser. Nos. 12/884,890 and 13/066,741 (also see, e.g. FIG. 1 hereto) filtering colors (wavelengths) and/or polarization is important so that each fringe projection signal can be analyzed separately, and the final set of information is used to provide topograph mapping with GH correction.

Applicants currently believe using spatially separated filtering may limit the region on the detector along the scan direction that can be used. With a detector having a plurality of pixels (e.g. a charge-coupled-device, CCD detector) the more pixels that are used to make topography measurements, the more averaging that can be done to reduce the random component of a fringe projection measurement.

Therefore, in the present invention, applicants want to utilize as many pixels of the detector as possible. The present invention builds on the concept of application Ser. Nos. 12/884,890 and 13/066,741 by providing appropriate filters that are integrally associated with the CCD when the detector is fabricated. This allows the different wavelengths and polarizations to be sensed simultaneously and on the same detector without spatially separating the filtering ahead of the detector. According to the present invention, a CCD detector has filters that are integrally associated with the detector and designed preferably to allow different wavelengths and polarizations to be sensed simultaneously on the same detector, at the different wavelengths and polarizations, without spatially separating the filtering from the CCD, and producing sensitivity to each wavelength and polarization on a pixel by pixel basis.

Figure 5:
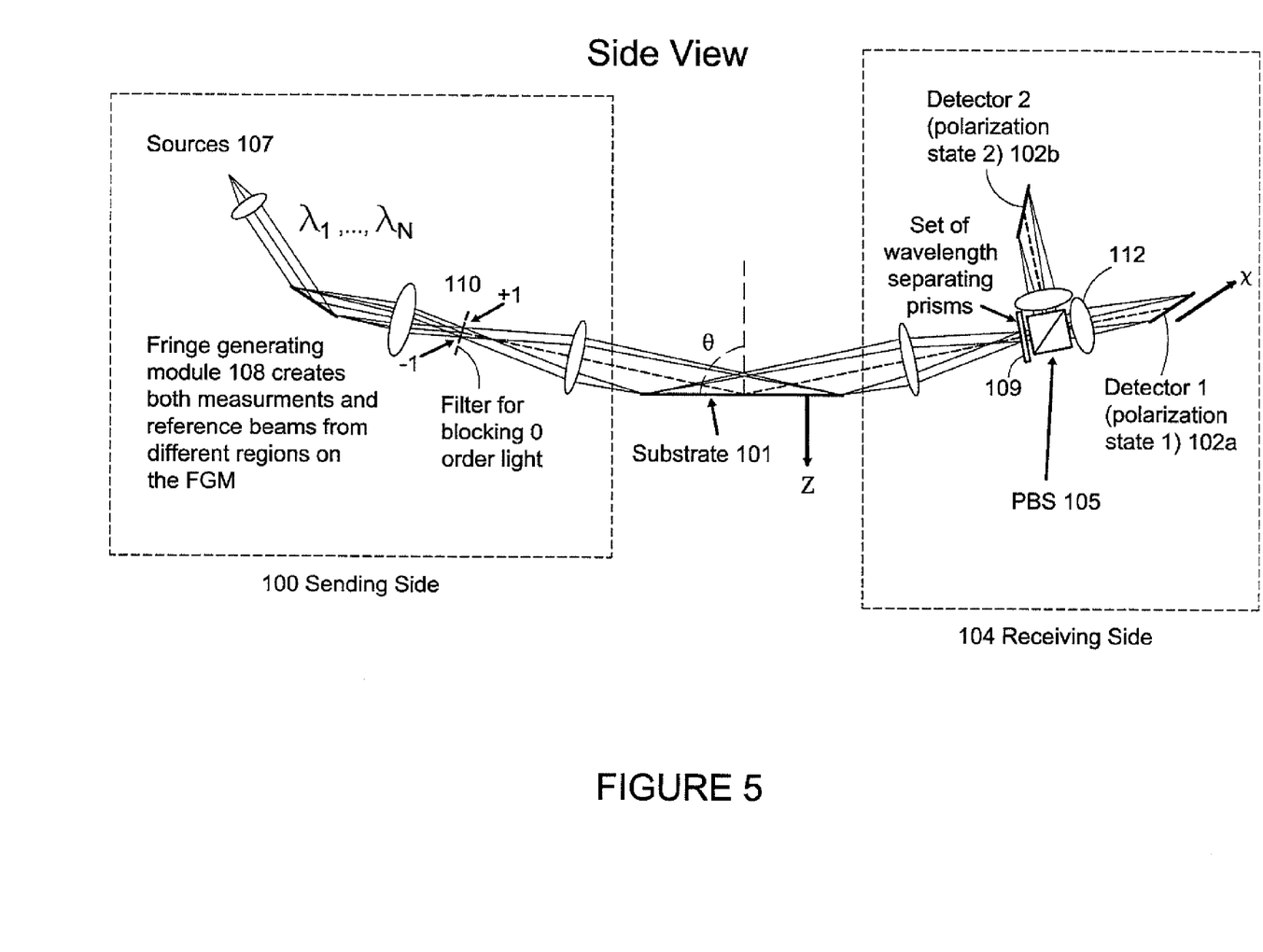
FIG. 5 schematically illustrates an AF system and method with polarization filtering spatially separated from a detector, according to application Ser. Nos. 12/884,890 and 13/066,741

Other advantages of the present invention include
  a. many of the prior techniques use mirrors, which can become misaligned during temperature changes of the optics or mechanics,
  b. separating the beams spatially with bulk optics (i.e. not at the CCO) means they go through different, separated air paths, and these separate air paths can introduce additional errors if the air temperature is not uniform (this potential error source is greatly reduced when the beams are filtered at the CCD), and
  c. using pixels as close to each other as possible minimizes the effects of CCD drift or deformation, or multiple camera displacement (for example, between the two sensors in FIG. 5).

According to the present invention, an image projected from a substrate is detected by
  a. a detector comprising a plurality of pixels, where the detector is configured to have either or both of polarization state or color filtering integrally associated with each pixel; and
  b. a light projection system configured to project light at the substrate, to image light reflected from the substrate to the detector and to produce data that is useful for mapping the topography of the substrate.

According to a preferred embodiment, the detector comprises a component (e.g. a CCD) with a plurality of pixels and also has either or both of polarization state or color filtering integrally associated with each pixel, so that either or both polarization state or color filtering is produced on a pixel by pixel basis at the detector. In this application, reference to a polarization or color filter being "integrally associated" with a detector means that the polarization or color filter is formed as part of the detector component (e.g. as a coating, film or covering plate on a CCD), or otherwise in direct contact with one or more of the elements that make up the detector component.

In an AF system and method that utilizes fringe projection and a detector configured according to the present invention, reflected light imaged to the detector can be, e.g. white light which has a plurality of wavelengths, and the color filtering for each pixel of the CCD component is for a specific subset of the wavelengths of the light reflected from the substrate. The color filtering for each pixel of the CCD component is done in a predetermined pattern on the CCD.

The light reflected from the substrate may also have a plurality of polarizations, and the polarization filtering for each pixel of the CCD component is for a specific subset of the polarizations of the light reflected from the substrate, and produces sensitivity to each wavelength and polarization at the CCD, on a pixel by pixel basis. With such a detector, the polarization filtering for each pixel of the CCD component is done in a predetermined pattern on the CCD. In addition, compensation for GH errors can be readily provided, according to the discloser of application Ser. Nos. 12/884,890 and 13/066,741, which are incorporated by reference herein.

Further features of the present invention will be apparent from the following detailed description and the accompanying drawings.

DETAILED DESCRIPTION

As described above, the present invention relates to an autofocus system and method that maps the topography of a substrate such as a semiconductor wafer, and in a manner designed to correct for GH effect. In addition, the present invention relates to a new and useful detector that has both color and polarization filtering integrally associated with the detector, so that polarization and color filtering is provided at the detector, on a pixel by pixel basis. The invention builds on the concepts shown and described in U.S. application Ser. Nos. 12/884,890 and 13/066,741, particularly for an AF system. The invention is described herein in relation to such an AF system and method, and in connection with a detector that comprises a charge-coupled device (CCD). From that description, the manner in which the present invention can be employed with various types of AF systems and methods, and with other forms of detectors will be clear to those in the art.

Initially, it is believed useful to describe the basic system and operating principles of the AF system and method of application Ser. Nos. 12/884,890 and 13/066,741, and to then describe the manner in which the present invention builds on such an AF system and method.

Figure 1:
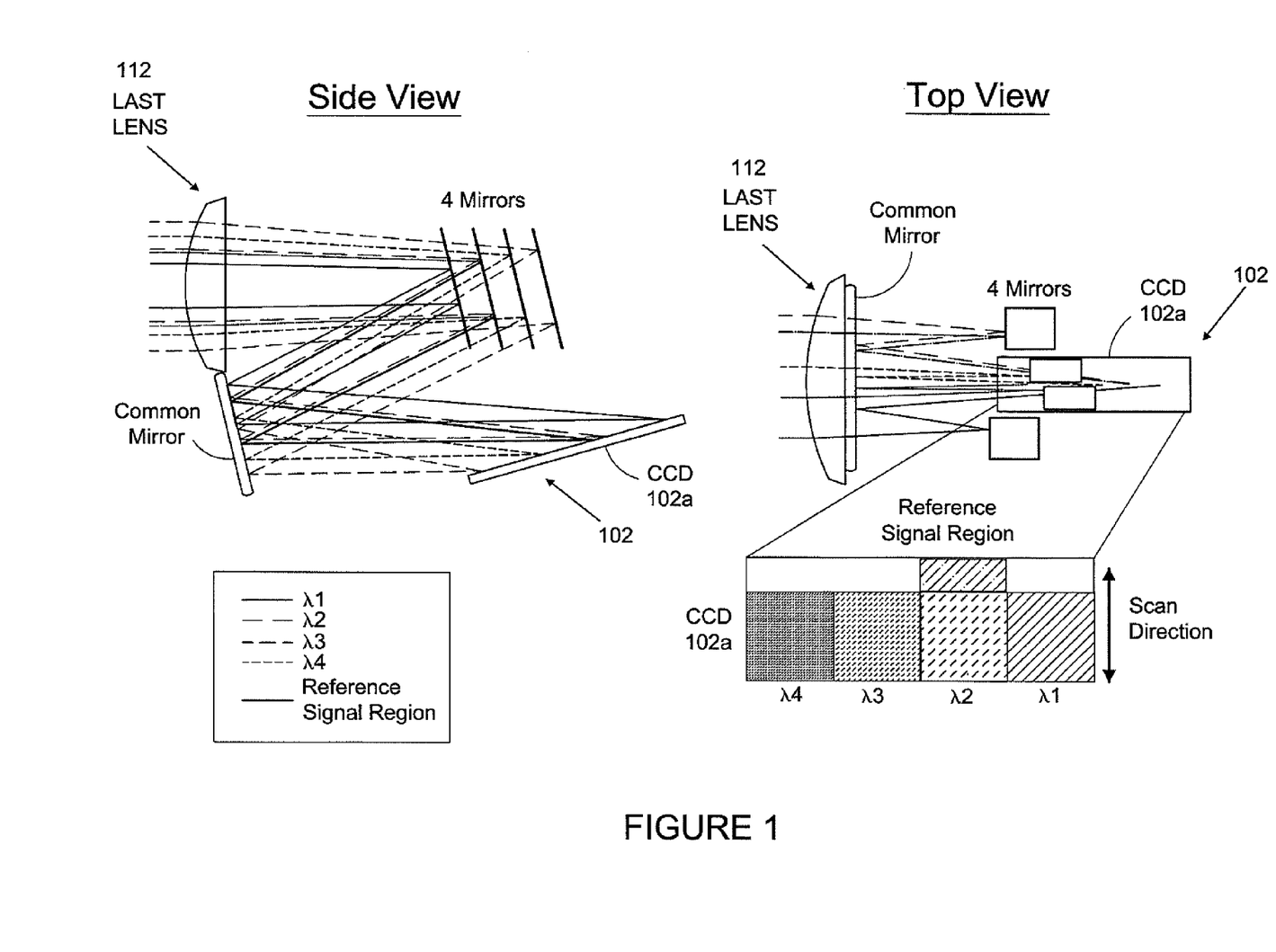
FIG. 1 schematically illustrates color filtering apparatus and method of a type shown and described in application Ser. Nos. 12/884,890 and 13/066,741.

Thus, FIGS. 1 and 5 schematically illustrate the principles of an autofocus (AF) system and method, using fringe projection, according to application Ser. Nos. 12/884,890 and 13/066,741. The system and method are particularly useful with a substrate which has been exposed with a pattern formed on a mask, where an illumination optical system is configured to illuminate light to the mask, and project the image of the mask to the substrate. U.S. Pat. Nos. 5,448,332 and 7,982,884, each of which is incorporated by reference herein, each discloses an exposure apparatus and method for exposing a substrate in such a manner, and it will be clear to those in the art that the AF system and method of the present invention would be useful in connection with the exposure apparatus and method of each of those patents. As shown in FIG. 5, the fringe projection AF system has a sending side 100, from which light from the source(s) 107 is directed at a substrate 101, and a receiving side 104, wherein light reflected from the substrate is directed to a detector 102. On the sending side 100, the light (e.g. broadband or "white" light) is reflected from a fringe generator 108, filtered by a filter 110 and reflected from the substrate 101. The fringe(s) of the reflected light is (are) detected at the detector 102 (see also FIGS. 3 and 4), and used to determine the initial position of the substrate surface in the z direction. Subsequent operation of the AF system is then used to determine changes in the z position, and those changes may be used to control movement of the stage that supports the substrate in the z direction. The "fringe shift", i.e. the amount by which the fringe is shifted, may be defined by $d=2\,m^2 z\,\text{Tan}\theta$, where z is the z position of the substrate, $\theta$ is the angle of incidence (shown in FIGS. 4 and 5), m is the magnification between the substrate and detector, and d is the fringe shift in the x direction along the detector (the x direction along the detector is shown in FIGS. 4, 5).

In FIG. 5, the filtering of the system of Ser. Nos. 12/884,890 and 13/066,741 is provided by a polarization beam splitters 105 located in the receiving side optics 104; in FIG. 5 it is shown just before the last lens element 112. In the schematic illustration of FIG. 1, color filtering of the type shown and described in 12/884,890 and 13/066,741 is provided by the arrangement of mirrors between the last lens 112 and the detector 102.

Thus, in the autofocus system and method of application Ser. Nos. 12/884,890 and 13/066,741, light is directed at the substrate 101, and light reflected from the substrate is imaged to a detector 102 to produce the data that is useful for mapping the topography of the substrate (and enables GH correction).

In a system and method of the type disclosed in U.S. application Ser. Nos. 12/884,890 and 13/066,741 (also see, e.g. FIGS. 1, 5 hereto) either a polarization beam splitter 105 and/or a system of prisms and mirrors are used to provide polarization and or color filtering that is spatially separated from the detector 102. Thus each fringe projection signal can be analyzed separately, and the final set of information is used, e.g., for GH correction, as described in U.S. application Ser. Nos. 12/884,890 and 13/066,741 that are incorporated by reference herein.

As described in U.S. application Ser. Nos. 12/884,890 and 13/066,741, the GH effect produces a shift of a beam when incident on an optical interface (e.g. a substrate that is imaged by an imaging optical system). The substrate surface will produce different phases on reflection for different angles of incidence, polarizations and wavelengths. In an imaging optical system which includes auto focus (AF) illumination of a substrate that is being imaged, this becomes a tilt in the pupil and a shift on the sensor (detector), which in turn translates into an error in the estimate of the z-position of the substrate.

In U.S. application Ser. Nos. 12/884,890 and 13/066,741, providing polarization and/or color filtering between the last optic and the detector is useful in providing GH correction. With the approach of FIG. 1, a complex set of mirrors can be provided near the CCD to direct the light to the proper location on the CCD detector. However, the approach of FIG. 1 may limit the region on the detector along the scan direction (y direction) and the direction perpendicular to the scan direction (the x direction shown in FIGS. 4 and 5) that can be used. The more pixels that are used to make measurements, the more averaging that can be done to reduce the random component of the errors. By separating different wavelengths, as shown in FIG. 1, there must be sections on the CCD in between the wavelengths that act like a buffer or transition region. Such a buffer or transition region produces no useful data for those pixels, so those pixels do not contribute to the measurement. Therefore, in the present invention, applicants want to utilize as many pixels as possible.

The present invention builds on the concept of application Ser. Nos. 12/884,890 and 13/066,741 by building in the appropriate filters to the CCD detector component 102a (see also FIGS. 2 and 3) when the detector is 102 fabricated. This allows the different wavelengths and polarizations to be sensed simultaneously and on the same detector without spatially separating the filtering from the detector. According to the present invention, a CCD detector component 102a preferably has filters designed to allow different wavelengths and polarizations to be sensed simultaneously on the same detector, at the different wavelengths and polarizations, without spatially separating the filtered fringe projection signal from the detector, thereby producing sensitivity to each wavelength and polarization.

FIG. 4 schematically illustrates an AF system and method according to the present invention. The system and method of FIG. 4 is basically similar to the system and method of FIG. 5 (and provides fringe projection to the substrate 101 in light emanating from the source(s) 107 and imaging of the reflected light to the detector, as in FIG. 1), except that polarization and/or color filtering is integrally connected to the detector 102. Thus, there is no filtering in the space between the last lens element 112 and the detector 102.

According to the present invention, the CCD detector component 102a comprises a plurality of pixels and also has either or both of polarization state or color filtering integrally associated with each pixel, so that polarization state or color filtering is produced on a pixel by pixel basis at the detector. In this application, reference to a polarization or color filter being "integrally associated" with a detector means that the polarization or color filter is formed as part of the detector component (e.g. as a coating, film or covering plate on a CCD), or otherwise in direct contact with one or more of the elements that make up the detector component.

The detector 102 comprises a camera, and preferably a camera that includes a CCD detection component 102a. The light reflected from the substrate 101, can be, e.g. white light which has a plurality of wavelengths, and the color filtering for each pixel of the CCD component 102a is for a specific subset of the wavelengths of the light reflected from the substrate. The color filtering for each pixel of the CCD component 102a is done in a predetermined pattern on the CCD, as explained herein in connection with the embodiments of FIGS. 2 and 3.

The light reflected from the substrate 101 may also have a plurality of polarizations, and the polarization filtering for each pixel of the CCD component 102a is for a specific subset of the polarizations of the light reflected from the substrate 101. With such a detector, the polarization filtering for each pixel of the CCD component 102a is done in a predetermined pattern on the CCD.

The present invention is particularly useful with an autofocus system and method that comprises a fringe projection system in which light fringes are projected at the substrate, and the reflected light fringes are imaged to the detector through the polarization or color filtering integrally associated with the detector.

There are several ways that color and/or polarization filtering can be integrally connected with the CCD component 102a. For example, materials such as dielectrics or metals that absorb or reflect at different wavelengths, can be deposited on top of the pixels of the CCD component 102a (e.g. by lithography) that will change (filter) the spectral response of different pixels. Polarization filtering can be accomplished by using a steep angle of incidence on the substrate, coupled with a film or cover plate for each pixel of the CCD detector 102a.

As an example, with the present invention, the fringe projection (FP) system can use 4 wavelengths sampled at two orthogonal linear polarization states, for a total of 8 different signals. In the simplest approach, each row of pixels could be coated to accept one of the 8 signals, such that all 8 signals are measured every 8 pixel rows. For an 8192 row CCD, this allows >1000 pixels per signal across the wafer diameter, or more than 2 measurements at each wavelength within a 1 mm region on the substrate.

Also, the present invention is designed such that each wavelength/polarization is measured at every frame collected by the CCD. The reference light could also be interleaved on the sensor, assuming it is incident at a specific wavelength that is exclusive of the measurement wavelengths.

It should be noted that the present invention is designed to work particularly well when custom sensors are being fabricated for mass production.

Another advantage of the present invention is that the illumination system could be vastly simplified. It should be possible to illuminate with a white light source since there is no longer a need to spatially separate the multiple wavelengths in the pupil. Also, the source could contain both polarizations simultaneously. Perhaps the best combination would be to use a white light source for the reference also and alternate reference and measurement frames in time, so any thermal drift or other issues from the CCD are compensated by the reference.

The measurements at multiple wavelengths and polarizations are not made at exactly the same location on the substrate, which could lead to issues with the Goos Hanchen (GH) correction. However, in practice, two signals could be interleaved along the column direction (for example, same wavelength but both polarizations), which reduces the effects of this potential problem.

Figure 2:
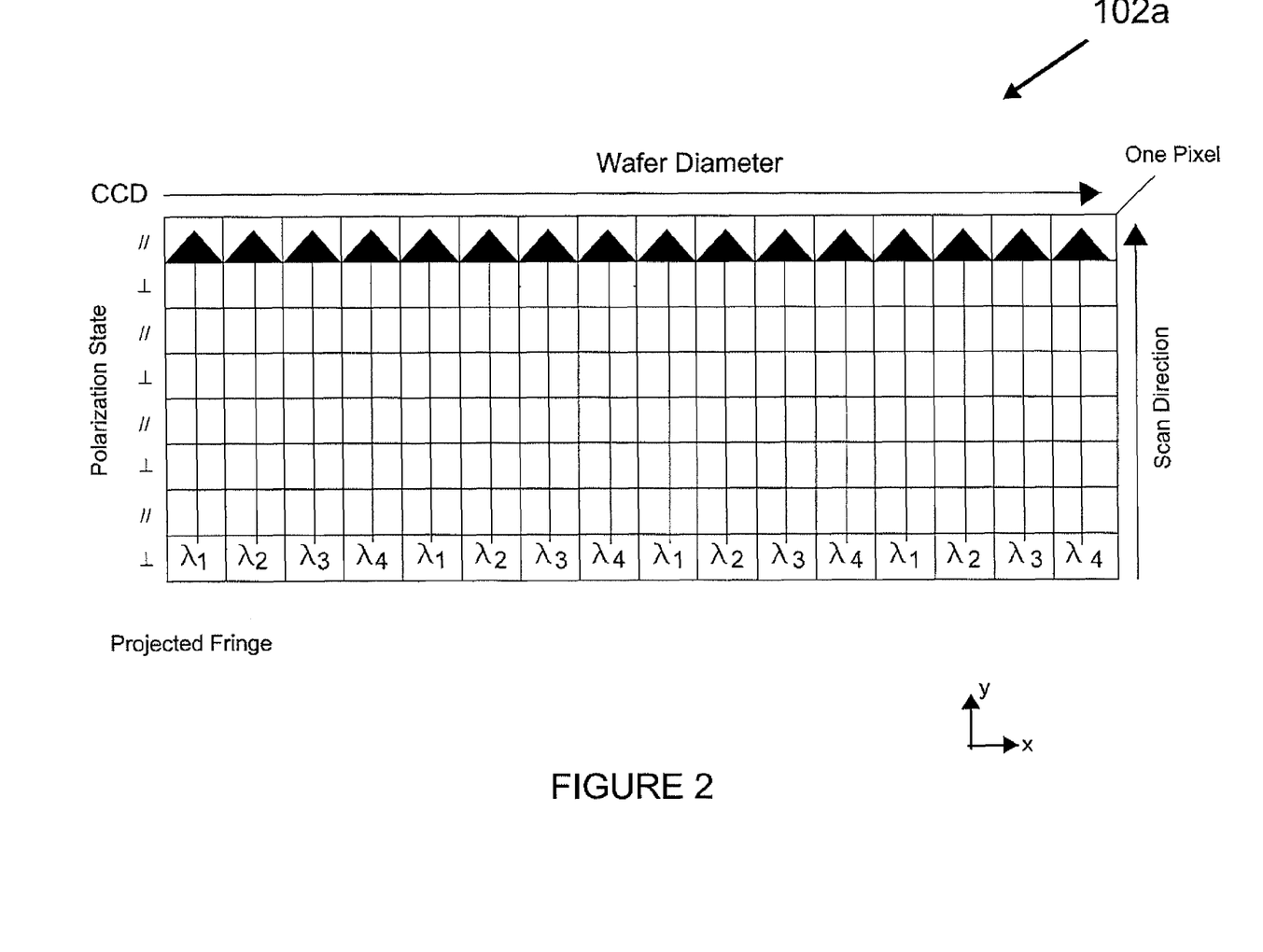
FIGS. 2 and 3 show CCD detectors illustrating two schemas for pixel by pixel filtering, according to the present invention.
Figure 3:
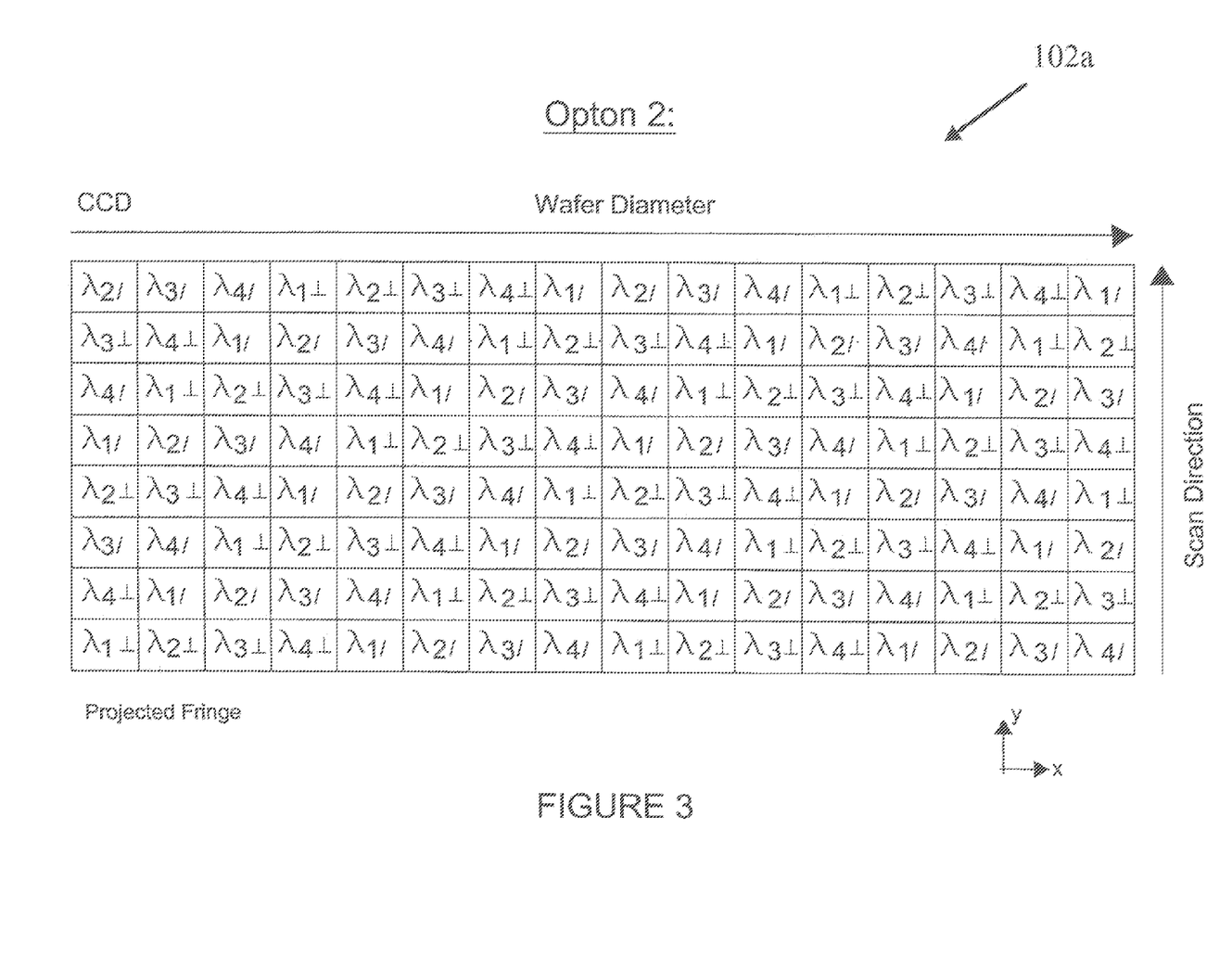
Figure 4:
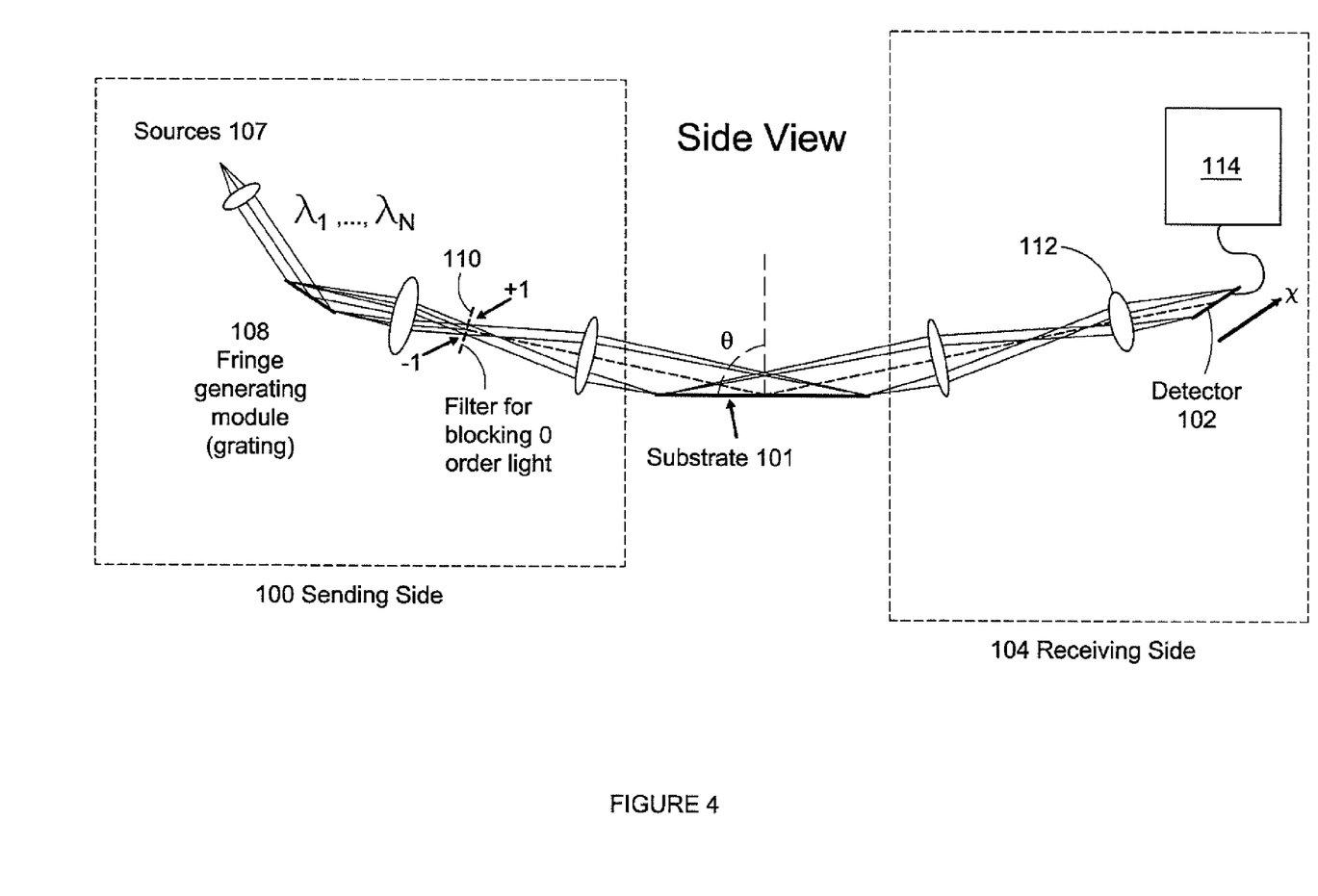
FIG. 4 schematically illustrates an AF system and method according to the present invention.

Two options for providing a CCD component 102a according to the present invention are shown in FIGS. 2 and 3. In option 1, shown in FIG. 2, each CCD column is coated to detect a wavelength band ($\gamma_1, \gamma_2, \ldots$), where the resolution of the optical system is much larger than a pixel at the CCD (as a non-exclusive example, the optics resolution could be about 4 pixels). Therefore, the GH correction will still work. In addition, every other pixel in y could sense orthogonal polarization states. In this option, the fringes are rotated slightly as described in application Ser. Nos. 12/884,890 and 13/066,741.

In option 2, shown in FIG. 3, the wavelength sensitivity of the CCD component 102a goes along a diagonal across the CCD component. This allows all the different wavelength bands to 'see' the same region on the substrate, at both polarizations, as the substrate scans in the scan direction. The rotation angle of the fringes relative to the y-axis is tailored to the pixel spacing to ensure the right phase steps between subsequent measurements at the same wavelength/polarization.

It should be noted that in addition to the two options described herein, there may be many other ways to arrange the filters; the two options described and shown in FIGS. 2 and 3 are just two examples. It may also be desirable to interleave the reference signal in these pixelated patterns.

Thus, the present invention provides a concept for multiplexing measurement beams (multiple wavelengths and polarizations) and reference beams on the detector, which simplifies the overall optical system for a fringe projection autofocus system by using a CCD detector that has filters designed to allow different wavelengths and polarizations to be sensed simultaneously on the same detector, at the different wavelengths and polarizations, without spatially separating the polarization and color filtering from the detector, thereby producing sensitivity to each wavelength and polarization. Moreover, the present invention provides a CCD detector that allows for a relatively simple illumination system and simple optics.

Other advantages of the present invention include
a. many of the prior techniques use mirrors, which can become misaligned during temperature changes of the optics or mechanics,
b. Separating the beams spatially with bulk optics (i.e, not at the CCD) means they go through different, separated air paths, and these separate air paths can introduce additional errors if the air temperature is not uniform (this potential error source is greatly reduced when the beams are filtered at the CCD)
c. using pixels as close to each other as possible minimizes the effects of CCD drift or deformation, or multiple camera displacement, as would be an issue with FIG. 5.

With the foregoing disclosure in mind, the manner in which various types of AF systems and methods can be designed to provide topography mapping including GH correction, and the manner in which polarization and color filtering can be provided in a CCD component, on a pixel by pixel basis, will be apparent to those in the art.

The invention claimed is:

1. An optical imaging system having an optical axis and operable to produce a data output representing a height profile of a predetermined surface being imaged, the imaging optical system comprising:
   a fringe projection system structured to optically image a first light pattern, defined by a fringe generating module inside the fringe projection system in polychromatic light incident onto the fringe generating module, onto the predetermined surface in a first direction that is oblique with respect to the predetermined surface to form a second light pattern thereon,
      wherein the first light pattern includes an array of linearly extended areas of high and low light irradiance, and
      wherein the second light pattern is spatially-periodic in a second direction;
   a fringe detection system including a detector having a two-dimensional array of pixels defining a detection surface and a first optical filter integrated with the detection surface;
   a fringe relay system disposed between the fringe projection system and the fringe detection system and configured to optically image the second light pattern onto the detection surface to form an image of the second light pattern thereon, the image of the second light pattern being spatially-periodic in a third direction; and
   a second optical filter disposed across the optical axis and configured to modify at least one of a spectrum, state of polarization, phase, and irradiance of light delivered to said detection surface such as to compensate an error contributed to the data output by a Goos-Hanchen shift experienced by the polychromatic light at the predetermined surface.

2. An optical imaging system according to claim 1, further comprising a processing system, operably connected to the fringe detection system and configured to receive optical data from the detector and produce the data output in which the error has been corrected, wherein the error is defined as an error contributed to the data output by a Goos-Hanchen shift experienced by the polychromatic light at the predetermined surface and averaged over wavelengths and polarizations of light incident onto the detection surface.

3. An optical imaging system according to claim 2,
   wherein the optical data from the detector includes reference optical data representing light acquired by the detector at a first wavelength and measurement optical data representing light acquired by the detector from the predetermined surface at a second wavelength, the first and second wavelengths being different, and
   wherein the processing system is configured to receive the reference and measurement optical data in alternating data frames to compensate thermal drift of the detector.

4. An optical imaging system according to claim 1, wherein the fringe generating module includes a grating configured to operate as a diffraction grating in the polychromatic light.

5. An optical imaging system according to claim 1, wherein a combination of
   i) an angle between a direction, in which the fringe relay system images the second light pattern onto the detection surface, and the detection surface
   and
   ii) the second optical filter
defines polarization filtering of light incident onto the detection surface.

6. An optical imaging system according to claim 5, further comprising a light source configured to generate the polychromatic light that is unpolarized.

7. An optical imaging system according to claim 1, wherein the second optical filter includes at least one of a dynamic filter and an interference filter.

8. An optical imaging system according to claim 1,
   wherein the detector is disposed such that columns of the two-dimensional array of pixels are parallel to a direction of scanning of the predetermined surface in a lithographic exposure tool that includes the optical imaging system,
   wherein the first optical filter is configured to transmit light at a first wavelength to each pixel in a first column of the two-dimensional array of pixels, at a second wavelength to each pixel in a second column of the two-dimensional array of pixels, and at a third wavelength to each pixel in a third column of the two-dimensional array of pixels, the second and third columns being immediately adjacent to the first column,
   the first, second, and third wavelengths being different from one another.

9. An optical imaging system according to claim 8, wherein light received by a first pixel of a column of the two-dimensional array has a first state of polarization, wherein light received by a second pixel of said column of the two-dimensional array that is immediately adjacent to the first pixel has a second state of polarization, the first and second states of polarization being orthogonal to one another.

10. An optical imaging system having an optical axis and operable to produce a data output representing a height profile of a predetermined surface being imaged, the imaging optical system comprising:
   a fringe projection system structured to optically image a first light pattern, defined by a fringe generating module inside the fringe projection system in polychromatic light incident onto the fringe generating module, onto the predetermined surface in a first direction that is oblique with respect to the predetermined surface to form a second light pattern thereon,
      wherein the first light pattern includes an array of linearly extended areas of high and low light irradiance;

a fringe detection system including a detector having a two-dimensional array of pixels defining a detection surface and a first optical filter integrated with the detection surface;

a fringe relay system disposed between the fringe projection system and the fringe detection system and configured to optically image the second light pattern onto the detection surface to form an image of the second light pattern thereon; and a second optical filter disposed across the optical axis and configured to modify at least one of a spectrum, state of polarization, phase, and irradiance of light delivered to said detection surface such as to compensate an error contributed to the data output by a Goos-Hanchen shift experienced by the polychromatic light at the predetermined surface, wherein the detector is disposed such that columns of the two-dimensional array of pixels are parallel to a direction of scanning of the predetermined surface in a lithographic exposure tool that includes the optical imaging system, wherein the first optical filter is configured to transmit light at a first wavelength to each pixel in a first diagonal of the two-dimensional array of pixels, at a second wavelength to each pixel in a second diagonal of the two-dimensional array of pixels, and at a third wavelength to each pixel in a third diagonal of the two-dimensional array of pixels, the second and third diagonals being immediately adjacent to the first diagonal, the first, second, and third wavelengths being different from one another.

11. An optical imaging system according to claim 1,
wherein the fringe relay system includes an optical element structured to change a curvature of a wavefront of light relayed by said optical element towards the detection surface, and wherein the detection surface is oblique with respect to an axis defined by the optical element.

12. A method for determining a height profile of a surface being measured with an optical imaging system, the method comprising with the use of a fringe projection system of the optical imaging system, imaging a first light pattern onto the predetermined surface to define a second light pattern on the predetermined surface, the first light pattern defined by a fringe generating module inside the fringe projection system in polychromatic light that is incident onto the fringe generating module, said first light pattern including alternating linearly extended zones of high and low light irradiance;

with the use of a fringe relay system of the optical imaging system, imaging the second light pattern onto an image plane through a first optical filter to form an image of the second light pattern thereon, the image plane defined by a two-dimensional array of pixels of a detector of the optical imaging system, the first optical filter having a spatial distribution of a spectral characteristic that defines a first spatial sequence of pixels of the two-dimensional array each of which receives light at a first wavelength, the first spatial sequence of pixels extending transversely to a direction in which areas of high and low light irradiance of the image are extended;

and further comprising positioning the detector such that columns of the two-dimensional array of pixels are parallel to a direction of scanning of the predetermined surface in a lithographic exposure tool that includes the optical imaging system, and wherein imaging a second light pattern includes transmitting light reflected from the predetermined surface through the first optical filter configured such that each pixel in a first diagonal of the two-dimensional array receives light at a first wavelength, each pixel in a second diagonal of the two-dimensional array receives light at a second wavelength, and each pixel in a third diagonal of the two-dimensional array receives light at a third wavelength, the second and third diagonals being adjacent to the first diagonal, the first, second, and third wavelengths being different from one another.

13. A method according to claim 12, further comprising
optically filtering polychromatic light transmitted from the fringe generating module towards the detector with the use of at least one of a dynamic filter and an interference filter that is disposed across a beam of said polychromatic light, to modify at least one of a spectrum, state of polarization, phase, and irradiance of light delivered to said detection such as to compensate an error contributed to a determination of said height profile by a Goos-Hanchen shift, wherein said Goos-Hanchen shift has been introduced into the incident polychromatic light as a result of interaction thereof with said pre-determined surface.

14. A method according to claim 12, further comprising
positioning the detector such that columns of the two-dimensional array of pixels are parallel to a direction of scanning of the predetermined surface in a lithographic exposure tool that includes the optical imaging system, and wherein the imaging a second light pattern includes transmitting light reflected from the predetermined surface through the first optical filter configured such that each pixel in a first column of the two-dimensional array receives light at a first wavelength, each pixel in a second column of the two-dimensional array receives light at a second wavelength, and each pixel in a third column of the two-dimensional array receives light at a third wavelength, the second and third columns being immediately adjacent to the first column, the first, second, and third wavelengths being different from one another.

15. A method according to claim 14, wherein the imaging a second light pattern includes receiving light having a first state of polarization by a first pixel of a column of the two-dimensional array, receiving light having a second state of polarization by a second pixel of said column, the second pixel being adjacent to the first pixel, the first and second states of polarization being orthogonal to one another.

16. A method according to claim 12, further comprising irradiating the fringe generating module with polychromatic unpolarized light from a source of light.

17. A method according to claim 12, further comprising
at the detector, receiving a reference beam of light at a second wavelength that is different from the first wavelength, and with a data processing system operably connected to the detector, processing first optical data and second optical data in alternating data frames to compensate thermal drift of the detector, the first optical data representing light received by the detector at the first wavelength, the second optical data representing light received by the detector at the second wavelength.

18. An optical imaging system according to claim 10, wherein the second light pattern is spatially-periodic in a second direction and the image of the second light pattern is spatially-periodic in a third direction.

19. An optical imaging system according to claim 10, further comprising a processing system, operably connected to the fringe detection system and configured to receive optical data from the detector and produce the data output in which the error has been corrected, wherein the error is defined as an error contributed to the data output by a Goos-Hanchen shift experienced by the polychromatic light at the predetermined surface and averaged over wavelengths and polarizations of light incident onto the detection surface.

20. An optical imaging system according to claim 19,
wherein the optical data from the detector includes reference optical data representing light acquired by the detector at a first wavelength and measurement optical data representing light acquired by the detector from the predetermined surface at a second wavelength, the first and second wavelengths being different,
and
wherein the processing system is configured to receive the reference and measurement optical data in alternating data frames to compensate thermal drift of the detector.

21. An optical imaging system according to claim 10, wherein the fringe generating module includes a grating configured to operate as a diffraction grating in the polychromatic light.

22. An optical imaging system according to claim 10, wherein a combination of
   i) an angle between a direction, in which the fringe relay system images the second light pattern onto the detection surface, and the detection surface
   and
   ii) the second optical filter
defines polarization filtering of light incident onto the detection surface.

* * * * *